US009748983B2

(12) United States Patent
Tanio

(10) Patent No.: US 9,748,983 B2
(45) Date of Patent: Aug. 29, 2017

(54) TRANSMITTER AND METHOD FOR TRANSMISSION CONTROL IN A TECHNIQUE OF DELTA SIGMA MODULATING

(71) Applicant: NEC CORPORATION, Tokyo (JP)

(72) Inventor: Masaaki Tanio, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/023,719

(22) PCT Filed: Jun. 3, 2014

(86) PCT No.: PCT/JP2014/002945
§ 371 (c)(1),
(2) Date: Mar. 22, 2016

(87) PCT Pub. No.: WO2015/045218
PCT Pub. Date: Apr. 2, 2015

(65) Prior Publication Data
US 2016/0233897 A1 Aug. 11, 2016

(30) Foreign Application Priority Data
Sep. 30, 2013 (JP) .................................. 2013-203892

(51) Int. Cl.
H03F 3/217 (2006.01)
H03F 1/32 (2006.01)
(Continued)

(52) U.S. Cl.
CPC ......... H04B 1/0475 (2013.01); H03F 1/3247 (2013.01); H03F 3/193 (2013.01);
(Continued)

(58) Field of Classification Search
CPC ............. H04L 27/2614; H04L 27/2623; H04L 27/3411; H03F 1/3241; H03F 1/3247;
(Continued)

(56) References Cited

U.S. PATENT DOCUMENTS 8,649,471 B1 * 2/2014 Charbonneau ...... H04L 27/2624
341/132
2003/0104792 A1 * 6/2003 Doi ........................ H03F 1/3247
455/114.2
(Continued)

FOREIGN PATENT DOCUMENTS

JP 2005-45767 A 2/2005
JP 2013-254995 A 12/2013

OTHER PUBLICATIONS

Antoine Frappé et al., "An All-Digital RF Signal Generator Using High-Speed ΔΣ Modulators", IEEE Journal of Solid-State Circuits, Oct. 2009, pp. 2722-2732, vol. 44, No. 10.
(Continued)

Primary Examiner — Aristocratis Fotakis
(74) Attorney, Agent, or Firm — Sughrue Mion, PLLC

(57) ABSTRACT

A transmitter according to the present invention includes: a baseband amplitude value distribution processor (90) for changing a distribution of an amplitude value of a baseband signal based on a control signal that has been input and outputting the baseband signal as an output signal; a digital transmitter (91) that ΔΣ modulates the output signal and transmits the modulated signal; an in-band distortion measurement unit (92) for measuring an in-band distortion amount of the output signal; an amplitude value distribution measurement unit (93) for calculating an amplitude value distribution of the output signal; a sideband distortion prediction unit (94) for predicting a sideband distortion amount occurring in the output signal by the digital transmitter (91) from the calculated amplitude value distribution; and a
(Continued)

baseband processing controller (95) for adjusting the control signal based on the measured in-band distortion amount and the sideband distortion amount and outputting the adjusted signal.

9 Claims, 13 Drawing Sheets

(51) Int. Cl.
H04B 1/04 (2006.01)
H03F 3/24 (2006.01)
H03F 3/30 (2006.01)
H03F 3/193 (2006.01)

(52) U.S. Cl.
CPC ........... *H03F 3/2171* (2013.01); *H03F 3/245* (2013.01); *H03F 3/3022* (2013.01); *H03F 2200/331* (2013.01); *H03F 2200/336* (2013.01); *H03F 2200/408* (2013.01); *H03F 2200/451* (2013.01)

(58) Field of Classification Search
CPC ...... H03F 1/32; H03F 3/217; H03F 2200/336; H03F 2200/331; H03F 2200/451; H04B 1/0475
See application file for complete search history.

(56) References Cited

U.S. PATENT DOCUMENTS

| | | | | |
|---|---|---|---|---|
| 2004/0005014 A1* | 1/2004 | Talwar | ................ | H04L 27/2624 375/295 |
| 2005/0017802 A1 | 1/2005 | Robinson | | |
| 2008/0019453 A1* | 1/2008 | Zhao | .................. | H04L 27/2623 375/260 |
| 2009/0156142 A1* | 6/2009 | Matsuura | ............. | H04B 1/0475 455/102 |
| 2011/0092173 A1* | 4/2011 | McCallister | .......... | H03F 1/3247 455/108 |
| 2012/0134399 A1* | 5/2012 | Gandhi | ................ | H03G 3/3042 375/224 |
| 2012/0263257 A1* | 10/2012 | Kim | ........................ | H03F 1/025 375/297 |
| 2013/0177062 A1* | 7/2013 | Hori | ...................... | H03M 3/392 375/227 |
| 2014/0184323 A1* | 7/2014 | Wilson | ...................... | H03F 3/38 330/10 |
| 2014/0341315 A1* | 11/2014 | Cova | .................... | H04B 1/0475 375/296 |

OTHER PUBLICATIONS

Jinseong Jeong et al., "A Polar Delta-Sigma Modulation (PDSM) Scheme for High Efficiency Wireless Transmitters", Microwave Symposium, 2007, IEEE/MTT-S International, Jun. 2007, pp. 73-76.

Andreas Wentzel et al., "Envelope Delta-Sigma-Modulated Voltage-Mode Class-S PA", Microwave Conference (EuMC), 2012 42nd European, Oct. 29-Nov. 1, 2012, pp. 120-123.

Jingqi Wang et al., "Vector Hole Punching Technique for OFDM Signals Using Circle-Tangent Shift and Unused Tones", IEEE Transactions on Microwave Theory and Techniques, Nov. 2009, pp. 2682-2691, vol. 57, No. 11.

Prem Swaroop et al., "Crest Factor Reduction through In-band and Out-of-band Distortion Optimization", IEEE Radio and Wireless Symposium, pp. 759-762, 2008.

R. Neil Braithwaite, "A Combined Approach to Digital Predistortion and Crest Factor Reduction for the Linearization of an RF Power Amplifier", IEEE Transactions on Microwave Theory and Techniques, Jan. 2013, pp. 291-302, vol. 61, No. 1.

International Search Report for PCT/JP2014/002945 dated Sep. 9, 2014 English Translation.

* cited by examiner

TRANSMITTER AND METHOD FOR TRANSMISSION CONTROL IN A TECHNIQUE OF DELTA SIGMA MODULATING

CROSS REFERENCE TO RELATED APPLICATIONS

This application is a National Stage of International Application No. PCT/JP2014/002945 filed Jun. 3, 2014, claiming priority based on Japanese Patent Application No. 2013-203892 filed Sep. 30, 2013, the contents of all of which are incorporated herein by reference in their entirety.

TECHNICAL FIELD

The present invention relates to a transmitter and a transmission control method, and more particularly, a technique of $\Delta\Sigma$ modulating a signal and transmitting the $\Delta\Sigma$ modulated signal.

BACKGROUND ART

A transmitter used in communication and broadcasting equipment such as a mobile telephone system or a wireless LAN device is required to operate so that its power consumption is low while maintaining a highly accurate transmission waveform without depending on the amount of transmission power. In particular, a transmission power amplifier, which is provided at the last stage of the transmitter, consumes a large amount of power. Therefore, the transmission power amplifier is required to have a high power efficiency.

Recently, a switching amplifier has been focused on as a power amplifier in which a high power efficiency can be expected. The switching amplifier is assumed to receive a pulse waveform signal as an input signal, thus achieving power amplification while maintaining its waveform. A pulse waveform signal amplified by the switching amplifier is adequately suppressed in frequency components other than a desired frequency component by a filter element and then the resulting signal is emitted from an antenna.

CITATION LIST

Non Patent Literature

[Non-Patent Literature 1] Antoine Frappe, "An All-Digital RF Signal Generator Using High-Speed Modulators", IEEE JOURNAL OF SOLID-STATE CIRCUITS, VOL. 44, NO. 10, October 2009, p. 2722-2732
[Non-Patent Literature 2] Jinseong Jeong, Yuanxun Ethan Wang, "A polar Delta-Sigma Modulation (PDSM) Scheme for High Efficiency Wireless Transmitters", Microwave Symposium, 2007. IEEE/MTT-S International, June 2007, p. 73-76
[Non-Patent Literature 3] Wentzel, A., "Envelope delta-sigma-modulated voltage-mode class-S PA", Microwave Conference (EuMC), 2012 42nd European, Oct. 29, 2012-Nov. 1, 2012, pp 120-123
[Non-Patent Literature 4] Jingqi Wang, "Vector Hole Punching Technique for OFDM Signals Using Circle-Tangent Shift and Unused Tones", IEEE TRANSACTIONS ON MICROWAVE THEORY AND TECHNIQUES, VOL. 57, NO. 11, November 2009

SUMMARY OF INVENTION

Technical Problem

The applicant has found a problem that will be described below regarding the power amplifier described above. The problem will now be described. This is the first time that the applicant has described the below power amplifier and this description does not describe the related art.

FIG. 7 is a circuit diagram showing a configuration example of a power amplifier called a D-class amplifier or an S-class amplifier (hereinafter it will be representatively referred to as a D-class amplifier), which is a representative example of the switching amplifier. FIG. 7 shows a configuration example of a D-class amplifier (it will be hereinafter referred to as a two-value D-class amplifier) that amplifies two-value signals of a logic "1" or "0".

The two-value D-class amplifier shown in FIG. 7 has a configuration in which a switch element is inserted between a power supply and an output terminal and between the output terminal and a ground potential. Complementary pulse signals are input to the two respective switch elements as open/close control signals and only one of the switch elements is controlled to be turned ON. The two-value D-class amplifier shown in FIG. 7 outputs a voltage (high level: logic "1") equal to a two-value power supply voltage when the switch element on the side of the power supply is ON and the switch element on the side of the ground potential is OFF and outputs a ground potential (low level: logic "0") when the switch element on the side of the power supply is OFF and the switch element on the side of the ground potential is ON.

Since the two-value D-class amplifier shown in FIG. 7 does not require a bias current, the power loss ideally becomes zero. A field-effect transistor or a bipolar transistor or the like may be used as a switching element.

A two-value transmitter combined with a $\Delta\Sigma$ (delta sigma) modulator that converts a baseband signal into a two-value signal is known, for example, as a transmitter that uses the two-value D-class amplifier shown in FIG. 7. In the two-value transmitter, the digital baseband signal converted into the two-value signal by the $\Delta\Sigma$ modulation is amplified to a desired level by the two-value D-class amplifier shown in FIG. 7 and then the digital baseband signal is output to an antenna via a filter.

Note that the D-class amplifier is not limited to the two-value D-class amplifier shown in FIG. 7 and may be a multi-value D-class amplifier shown in FIG. 8. The multi-value D-class amplifier shown in FIG. 8 is formed of a plurality of power supplies $V_1$-$V_N$ (N is an integer equal to or larger than 0) having output voltages (DC voltages) different from one another and a switch group including a plurality of switch elements inserted between the plurality of power supplies $V_1$-$V_N$ and an output terminal and between the output terminal and a ground potential $V_0$ and is able to output multiple values. Regarding the operation of the multi-value D amplifier, only one switch element corresponding to the power supply which is the output voltage or the ground potential is turned on and a power supply voltage or a ground potential supplied to the switch element that has been turned on is output.

By changing the two-value D-class amplifier to the multi-value D-class amplifier, the former stage has a parallel configuration. Since the functions necessary for forming the multi-value D-class amplifier do not greatly differ from those necessary for forming the two-value D-class amplifier, the two-value D-class amplifier may be easily changed to the multi-value D-class amplifier. In the following description, the D-class amplifier described is the two-value D-class amplifier.

FIG. 9 is a block diagram showing a configuration of a transmitter including a ΔΣ modulator and a D-class amplifier. The transmitter shown in FIG. 9 is obtained by reproducing the configuration of the transmitter shown in FIG. 1 of Non-Patent Literature 1 by the present inventor.

The transmitter shown in FIG. 9 includes a digital baseband circuit (Digital Baseband) 110, an RF signal generator 120 including a ΔΣ modulator, a driver amplifier 130, a D-class amplifier 140, and a filter 150.

The RF signal generator 120 ΔΣ modulates two orthogonal signals (I signal and Q signal) generated by the digital baseband circuit 110, up-converts the frequencies of the signals after they ΔΣ modulated into frequencies of a desired radio signal, adds two signals after the up-conversion, and outputs the resulting signal to the driver amplifier 130. The driver amplifier 130 amplifies the signal output from the RF signal generator 120 and outputs the amplified signal to the D-class amplifier 140. The switch element included in the D-class amplifier 140 is driven by the signal output from the driver amplifier 130. Accordingly, the D-class amplifier 140 amplifies the signal output from the driver amplifier 130 and outputs the amplified signal to an antenna via the filter 150 as a radio signal.

FIG. 10 is a block diagram showing a configuration of another transmitter including a ΔΣ modulator and a D-class amplifier. The transmitter shown in FIG. 10 is obtained by reproducing the configuration of the transmitter including the RF signal generator from the RF signal generator shown in FIG. 1 of Non-Patent Literature 2, for example, by the present inventor.

The transmitter shown in FIG. 10 includes a digital baseband circuit 210, an RF signal generator 220, a driver amplifier 230, a D-class amplifier 240, and a filter 250. The digital baseband circuit 210 shown in FIG. 10 outputs an amplitude signal r and phase orthogonal signals I' and Q' obtained by respectively dividing two orthogonal signals I and Q by the amplitude signal to the RF signal generator 220.

The RF signal generator 220 includes an IQ modulator (orthogonal modulator) 221, a comparator 222, a ΔΣ modulator 223, and a multiplier 224.

The IQ modulator 221 converts the phase orthogonal signals I' and Q' output from the digital baseband circuit 210 into an RF-band phase signal and outputs the converted signal to the comparator 222.

The comparator 222 converts the RF-band phase signal output from the IQ modulator 221 into a rectangular pulse phase signal and outputs the converted signal to the ΔΣ modulator 223 and the multiplier 224.

The ΔΣ modulator 223 ΔΣ modulates, using the RF-band phase signal as a clock signal, the amplitude signal r output from the digital baseband circuit 210 and outputs the modulated signal to the multiplier 224. The number of output values of the ΔΣ modulator 223 is set to be equal to the number of voltage values output from the D-class amplifier 240 provided in the subsequent stage.

The multiplier 224 synthesizes the output signal of the ΔΣ modulator 223 with the RF-band phase signal and outputs the synthesized signal to the driver amplifier 230. The driver amplifier 230 amplifies the output signal from the RF signal generator 220 and outputs the amplified signal to the D-class amplifier 240. The D-class amplifier 240 turns on or off the corresponding switch element according to the signal output from the driver amplifier 230 to amplify the output signal of the RF signal generator 220. The radio signal amplified in the D-class amplifier 240 is output to an antenna via the filter 250.

One problem that is common to the configurations of the D-class amplifiers including the ΔΣ modulators shown in FIGS. 9 and 10 is that the resulting distortion characteristics and efficiency characteristics significantly vary depending on the modulation signal to be used. More specifically, characteristics of distortion outside a signal bandwidth occurring due to quantization noise occurring in the ΔΣ modulator (hereinafter it will be referred to as a sideband distortion) and power efficiency characteristics vary depending on an amplitude value distribution of the modulation signals.

The power efficiency characteristics depending on the amplitude value of the modulation signal are analyzed in detail in FIG. 2 of Non-Patent Literature 3. FIG. 2 of Non-Patent Literature 3 shows a relation between a coding efficiency and a drain efficiency in the configurations of FIGS. 9 and 10. In the ΔΣ modulation, the coding efficiency becomes larger as the amplitude value becomes higher. Therefore, FIG. 2 of Non-Patent Literature 3 indicates that the drain efficiency (power efficiency) tends to be higher as the amplitude value of the signal becomes larger.

The amplitude-dependent distribution of the quantitative power efficiency for each apparatus is obtained by a simulation in which a parasitic element and a filter element of the D-class amplifier are added to the actual apparatus. Further, a more accurate distribution can be obtained by measuring the drain efficiency obtained when the amplitude value is changed in the actual apparatus. According to this simulation and this measurement, the power efficiency distribution dependent on the amplitude value can be obtained.

The sideband distortion characteristics dependent on the amplitude value of the modulation signal can be checked by a simulation of the ΔΣ modulation. FIG. 11 is one example of a graph obtained by quantifying the sideband distortion characteristics dependent on the amplitude value by the simulation in the configuration shown in FIG. 10. FIG. 11 shows the ratio of the frequency components other than the carrier frequency to the carrier frequency components when the amplitude value is a constant value (horizontal axis). This example shows that the resulting sideband distortion becomes larger as the amplitude value becomes closer to 0.

Further, a more accurate distribution of the sideband distortion amount dependent on the amplitude value for each apparatus can be obtained by measuring the ratio of the frequency components other than the carrier frequency to the carrier frequency components from a spectrum obtained when the amplitude value is changed in the actual apparatus.

As described above, since the power efficiency and the sideband distortion characteristics of the D-class amplifier including the ΔΣ modulator have dependency with respect to the amplitude value distribution of the modulation signals, the transmitter may operate in a low power efficiency or the sideband distortion is so large that the signal cannot reach the standard value of the signal depending on the modulation signal to be used.

FIG. 12 shows one example obtained by simulating an LTE signal having a bandwidth of 20 MHz by the D-class amplifier having a configuration shown in FIG. 10 and is a spectrum diagram of the output signal of the D-class amplifier. As shown in FIG. 12, while the bandwidth of 20 MHz can be restored, the sideband distortion occurs due to an influence of quantization noise caused by the ΔΣ modulation and Adjacent Channel Leakage Ratio (ACLR) does not reach the standard value −45 dBc.

In order to solve the aforementioned problem, it is required to change the distribution of the amplitude values of the modulation signals without changing the spectrum characteristics of the modulation signals and intrinsic information. The existing means for achieving this include Crest Factor Reduction (CFR) and Vector Hole Punch (VHP).

The CFR is baseband signal processing that suppresses the peak of the amplitude value of the modulation signal. FIG. 13 shows an example in which the CFR is applied. In FIG. 13, the dotted line shows the amplitude value of the modulation signal when the CFR is not performed and the solid line shows the amplitude value of the modulation signal after the CFR is performed. The amplitude value of the modulation signal after the CFR process is done is controlled in such a way that the amplitude value does not reach a predetermined threshold th1 (0.9 in FIG. 13) or larger as much as possible.

Conventionally, the CFR has been applied for the purpose of allowing amplification with high power efficiency in a linear region by suppressing the peak value of the signal and reducing the Peak to Average Power Ratio (PAPR) in an amplifier that is not a D-class amplifier (e.g., an A-class amplifier or an AB-class amplifier). However, since it is possible to change the amplitude value distribution of the modulation signals by suppressing the peak value of the amplitude, the CFR may be applied also to the baseband signal having the D-class amplifier configuration including the $\Delta\Sigma$ modulator, whereby it may be possible to improve the power efficiency and the distortion characteristics.

The VHP, which is another means for changing the amplitude value distribution, is a method of reducing the distribution of low amplitude values, which is different from the method of the CFR (Non-Patent Literature 4). FIG. 14 is an example in which the VHP is applied. In FIG. 14, the dotted line indicates the amplitude value of the modulation signal when the VHP is not performed and the solid line indicates the amplitude value of the modulation signal after the VHP is performed. The amplitude value of the modulation signal after the VHP is done is controlled in such a way that it does not become equal to or lower than a predetermined threshold th2 (0.1 in FIG. 14) as much as possible.

The VHP has been developed for the purpose of increasing the power efficiency in an analog amplifier which is not a D-class amplifier. Similar to the CFR, it is possible to change the amplitude value distribution of the modulation signals in the VHP. The VHP may therefore be applied to the baseband signal having the D-class amplifier configuration including the $\Delta\Sigma$ modulator. It is therefore possible to improve the power efficiency and the distortion characteristics.

As shown in FIG. 13, the CFR is means for determining the threshold in advance when it is being applied and suppressing the value in such a way that the value does not reach the amplitude value equal to or larger than the threshold when the modulation signal exceeds the amplitude value. Further, as shown in FIG. 14, the VHP is means for determining the threshold in advance when it is being applied and suppressing the value in such a way that the value does not reach the amplitude value equal to or smaller than the threshold when the modulation signal is below the amplitude value. However, in the configuration of the D-class amplifier including the $\Delta\Sigma$ modulator, a method of setting an appropriate threshold has not yet been known.

In the case of the CFR, the PARP of the signal decreases as the threshold is set to be smaller. Therefore, the frequency when the amplitude value becomes large increases and it is expected that the power efficiency will become high in the D-class amplifier configuration having the $\Delta\Sigma$ modulation. However, it is possible that an in-band distortion amount (Error Vector Magnitude (EVM), Modulation Error Ratio (MER) etc.) may be degraded and the signals may not be demodulated.

In the case of the VHP as well, the frequency when the modulation signal has the amplitude value of about 0 decreases as the threshold is set to be larger and it is possible to suppress the sideband distortion in the D-class amplifier configuration having $\Delta\Sigma$ modulation. However, it is possible that the in-band distortion may become too big to perform modulation.

The parameters that are set in advance when the CFR and VHP processes are executed not only include the thresholds but also various parameters including an attenuation amount of the cutoff frequency and the number of taps of a low-pass filter.

The present invention has been made in order to solve the aforementioned problems and aims to provide a transmitter and a transmission control method capable of achieving low distortion regardless of the type of the modulation signal in a transmitter that executes $\Delta\Sigma$ modulation.

Solution to Problem

A transmitter according to a first exemplary aspect of the present invention includes: a baseband amplitude value distribution processing means for changing a distribution of an amplitude value of a baseband signal based on a control signal that has been input and outputting the baseband signal as an output signal; a digital transmitter that $\Delta\Sigma$ modulates the output signal of the baseband amplitude value distribution processing means and transmits the modulated signal; an in-band distortion measurement means for measuring an in-band distortion amount of the output signal of the baseband amplitude value distribution processing means; an amplitude value distribution measurement means for calculating an amplitude value distribution of the output signal of the baseband amplitude value distribution processing means; a sideband distortion prediction means for predicting a sideband distortion amount occurring in the output signal by the digital transmitter from the amplitude value distribution calculated in the amplitude value distribution measurement means; and a baseband processing control means for adjusting the control signal to be input to the baseband amplitude value distribution processing means based on the in-band distortion amount measured in the in-band distortion measurement means and the sideband distortion amount predicted in the sideband distortion prediction means and outputting the adjusted signal.

A transmission control method according to a second exemplary aspect of the present invention includes: changing a distribution of an amplitude value of a baseband signal based on a control signal that has been input and outputting the baseband signal as an output signal; $\Delta\Sigma$ modulating the output signal that has been output and transmitting the modulated signal; measuring an in-band distortion amount of the output signal that has been output; calculating an amplitude value distribution of the output signal that has been output; predicting a sideband distortion amount occurring in the output signal by the $\Delta\Sigma$ modulation from the amplitude value distribution that has been calculated; and adjusting the control signal based on the in-band distortion amount that has been measured and the sideband distortion amount that has been predicted and outputting the control signal.

Advantageous Effects of Invention

According to each exemplary aspect of the present invention described above, it is possible to provide a transmitter and a transmission control method capable of achieving low distortion regardless of the type of the modulation signal in a transmitter that executes ΔΣ modulation.

DESCRIPTION OF EMBODIMENTS

First Exemplary Embodiment

Figure 1:
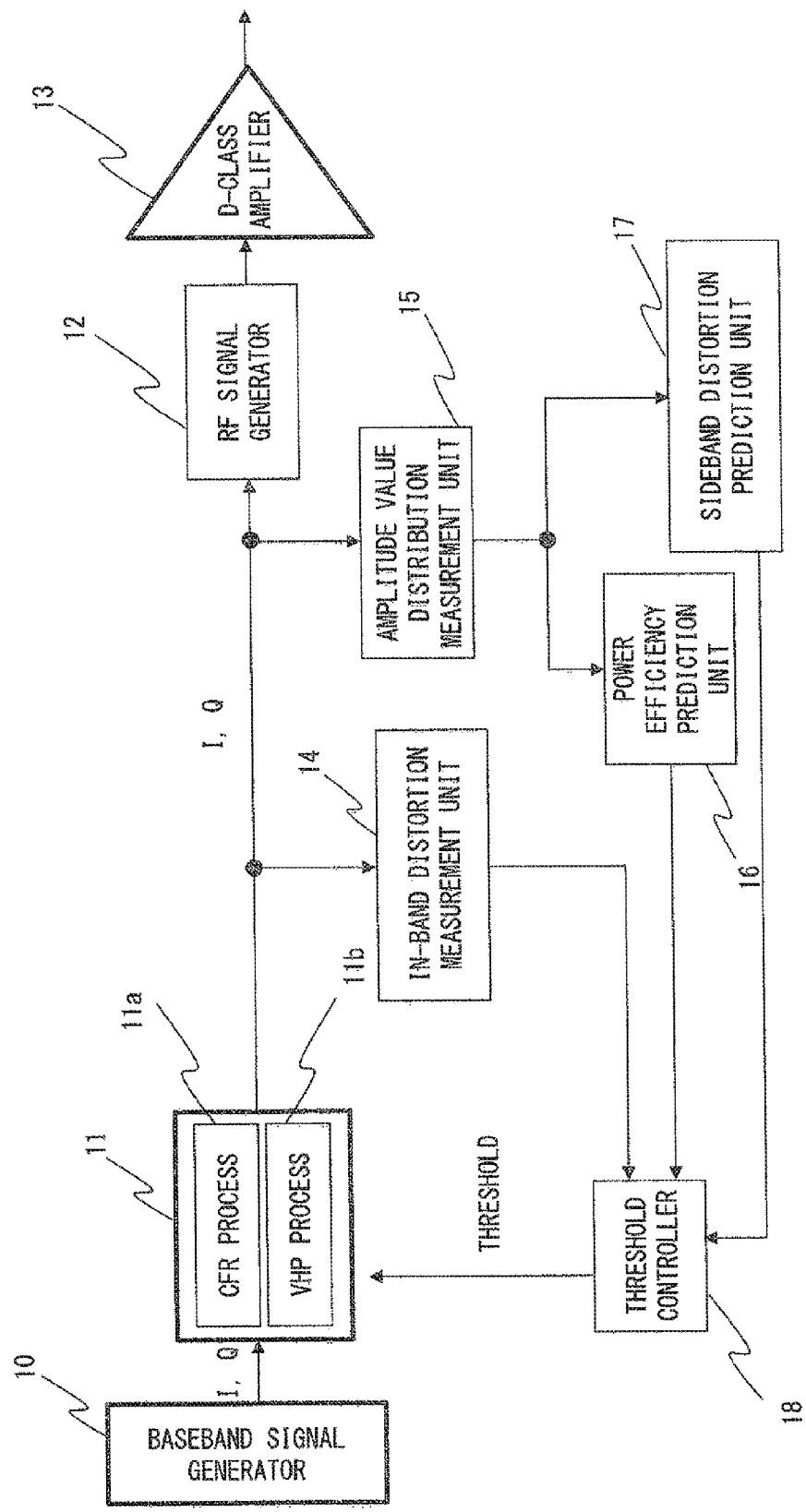
FIG. 1 is a block diagram showing one configuration example of a transmitter according to a first exemplary embodiment.

Next, with reference to the drawings, the present invention will be described. FIG. 1 is a block diagram showing one configuration example of a transmitter according to a first exemplary embodiment. The transmitter may be used, for example, in communication and broadcasting equipment such as a mobile telephone system or a wireless Local Area Network (LAN) equipment.

The transmitter shown in FIG. 1 includes a baseband signal generator 10, a baseband amplitude value distribution processor 11, an RF signal generator 12, a D-class amplifier 13, an in-band distortion measurement unit 14, an amplitude value distribution measurement unit 15, a power efficiency prediction unit 16, a sideband distortion prediction unit 17, and a threshold controller 18. The elements 10 to 18 are formed, for example, of electric circuits.

The threshold controller 18 outputs two types of thresholds for a CFR process and a VHP process to the baseband amplitude value distribution processor 11.

The baseband signal generator 10 generates baseband signals and outputs the baseband signals to the base amplitude value distribution processor 11. The base amplitude value distribution processor 11 performs a CFR process 11a and a VHP process 11b in the baseband amplitude value distribution processor 11 on the baseband signals output from the baseband signal generator 10 based on the two types of thresholds output from the threshold controller 18. The base amplitude value distribution processor 11 outputs IQ signals (I signal and Q signal), which are baseband signals on which the CFR process 11a and the VHP process 11b have been performed, to the RF signal generator 12.

Figure 10:
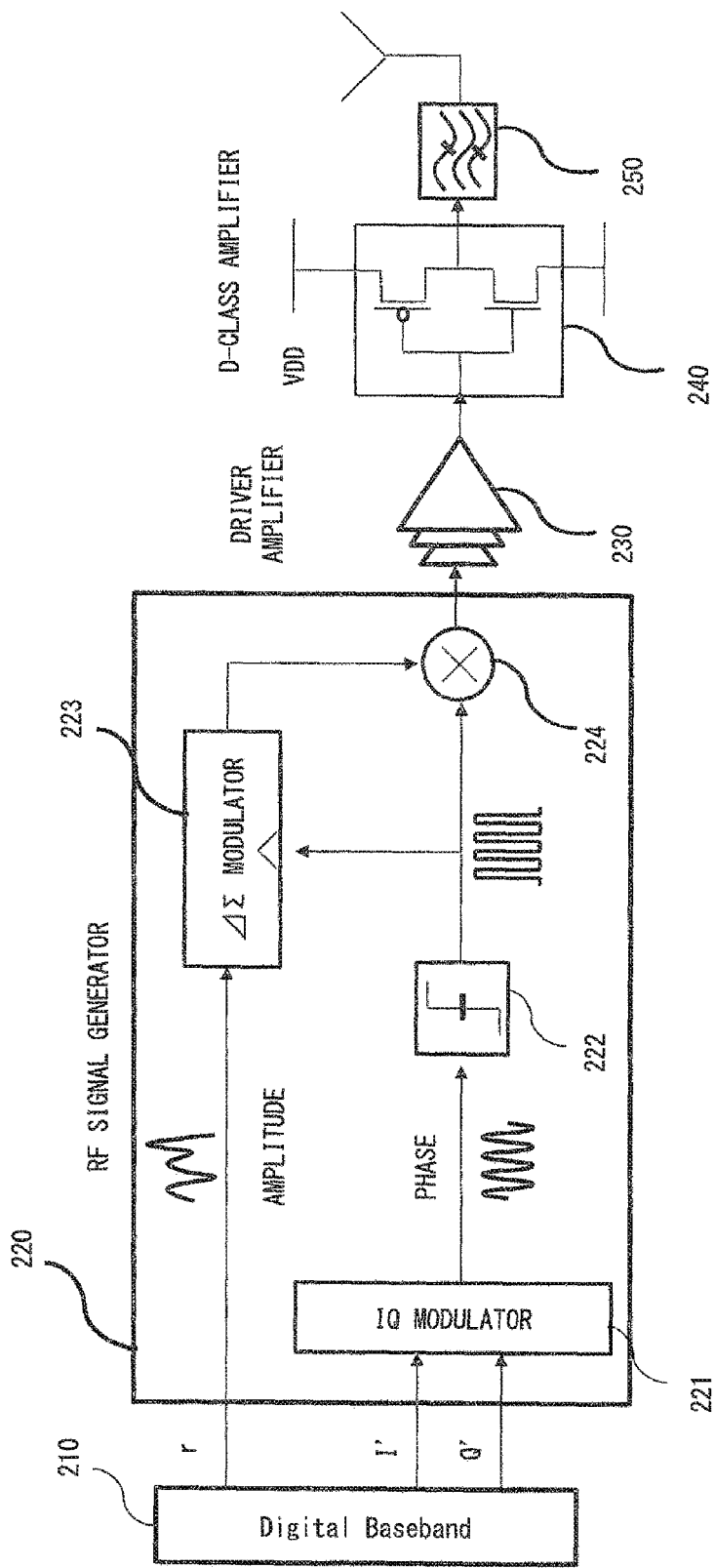
FIG. 10 is a diagram showing a configuration example of another transmitter including a ΔΣ modulator and a D-class amplifier.
Figure 11:
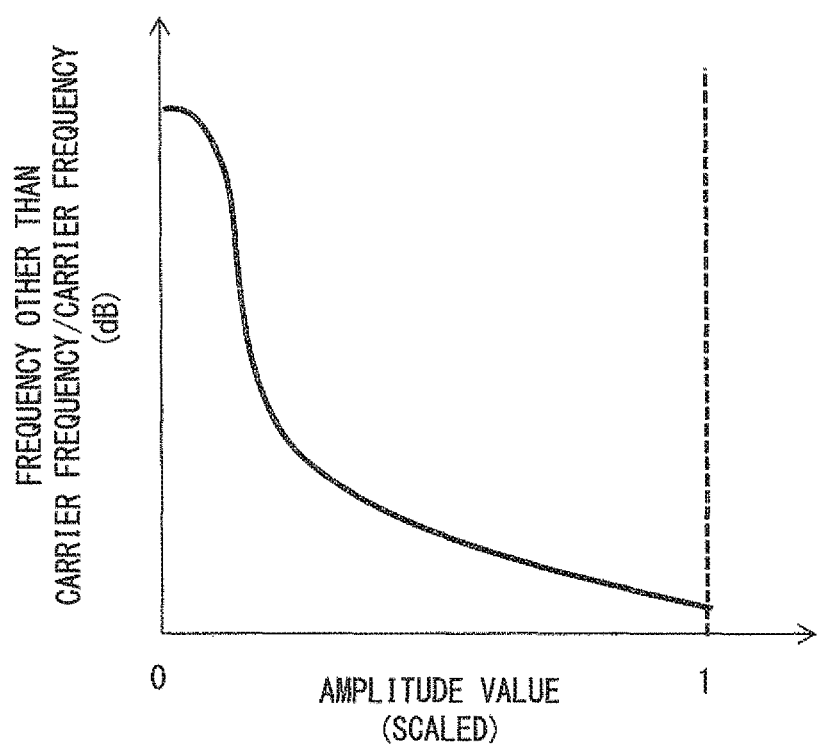
FIG. 11 is a diagram showing one example of a graph obtained by quantifying sideband distortion characteristics dependent on an amplitude value by a simulation in the configuration shown in FIG. 10.
Figure 12:
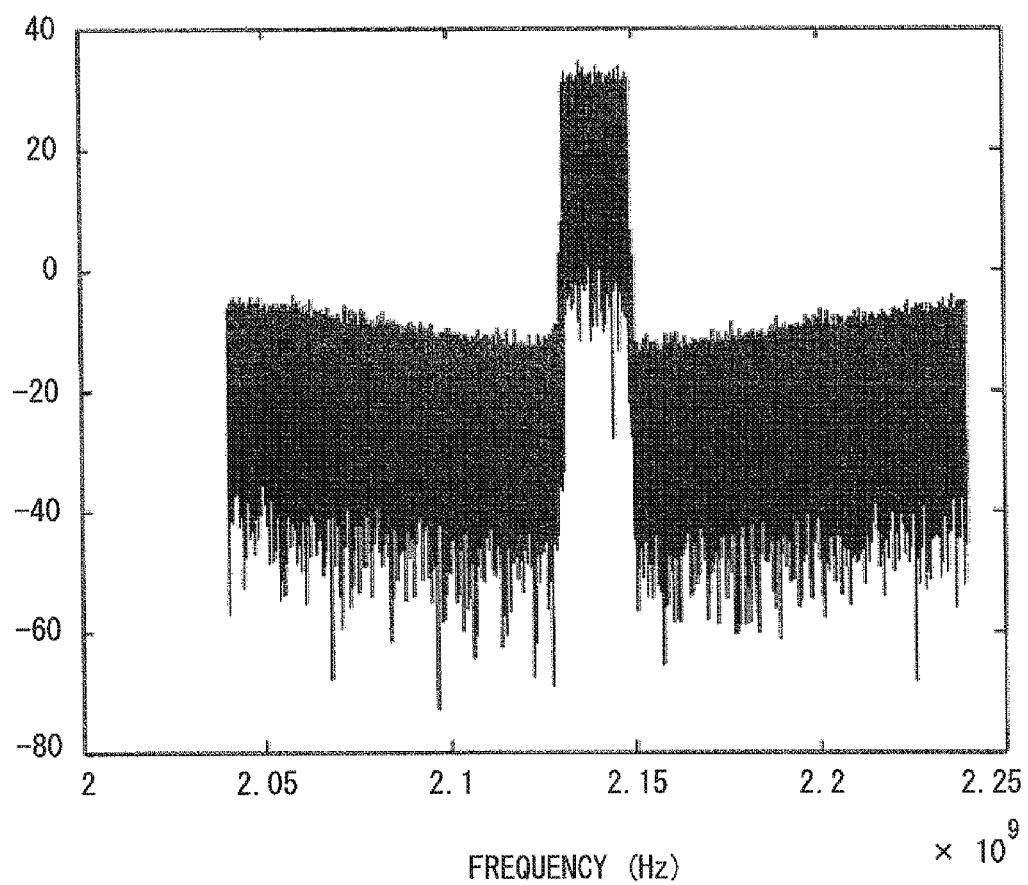
FIG. 12 is a diagram showing one example in which an LTE signal having a bandwidth of 20 MHz is simulated by the D-class amplifier having the configuration of FIG. 10.
Figure 13:
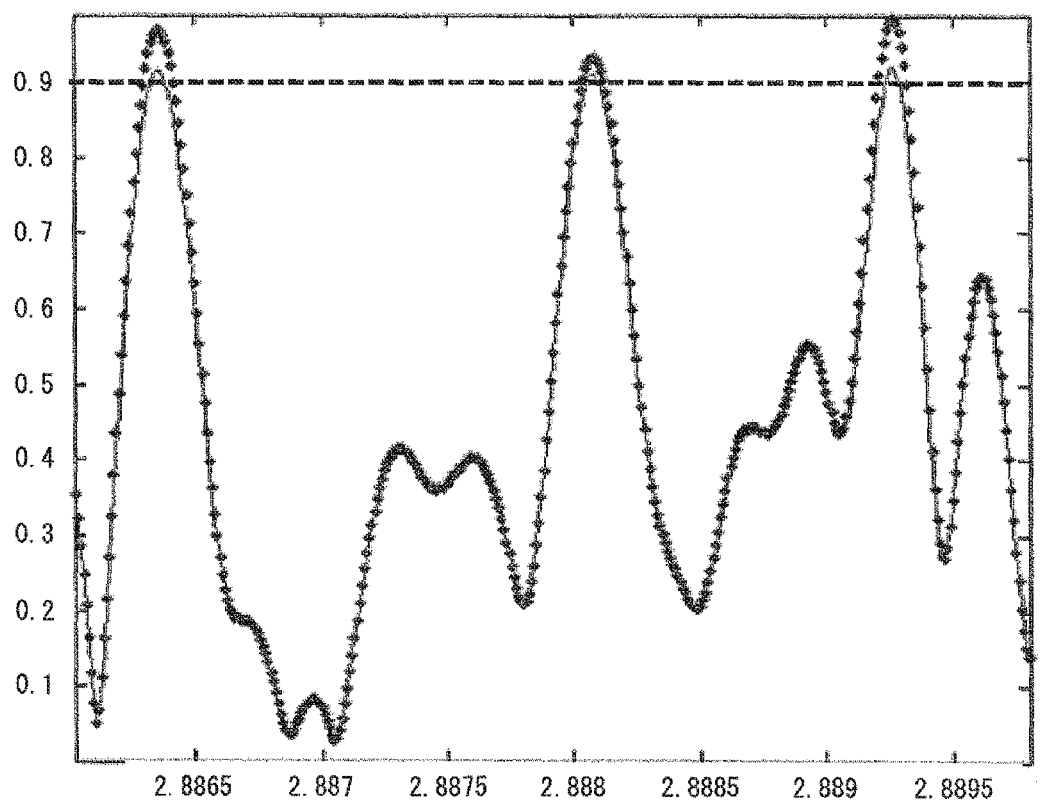
FIG. 13 is a diagram showing an example in which a CFR is applied.
Figure 14:
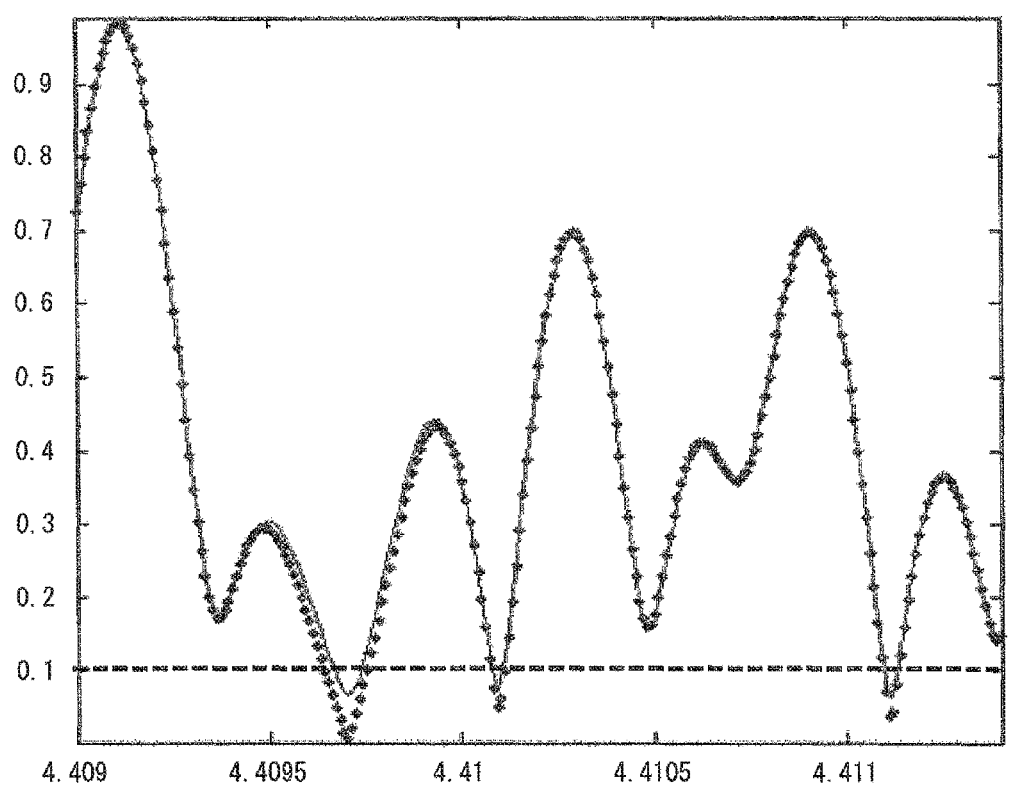
FIG. 14 is a diagram showing an example in which a VHP is applied.

The form of the signals output from the baseband amplitude value distribution processor 11 is appropriately changed according to the configuration of the RF signal generator 12. When the configuration of the RF signal generator 12 is an RF signal generator 220 shown in FIG. 10, for example, the IQ signals generated in the baseband amplitude value distribution processor 11 are converted into r, I', and Q' signals and the signals are output to the RF signal generator 12.

Figure 9:
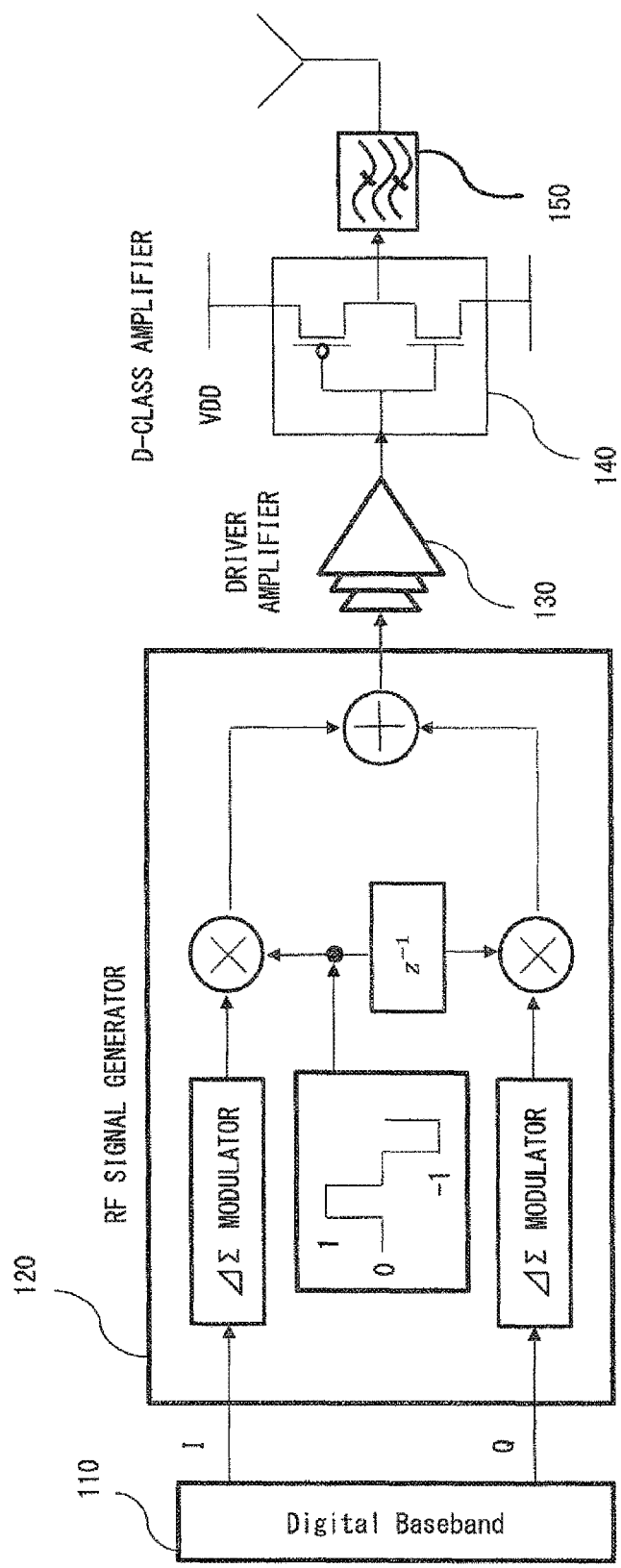
FIG. 9 is a diagram showing a configuration example of a transmitter including a ΔΣ modulator and a D-class amplifier.

The RF signal generator 12 ΔΣ modulates the IQ signals output from the baseband amplitude value distribution processor 11, generates a pulse signal, and outputs the pulse signal to the D-class amplifier 13. An RF signal generator 120 shown in FIG. 9 or an RF signal generator 220 shown in FIG. 10 may be used as the RF signal generator 12.

Figure 7:
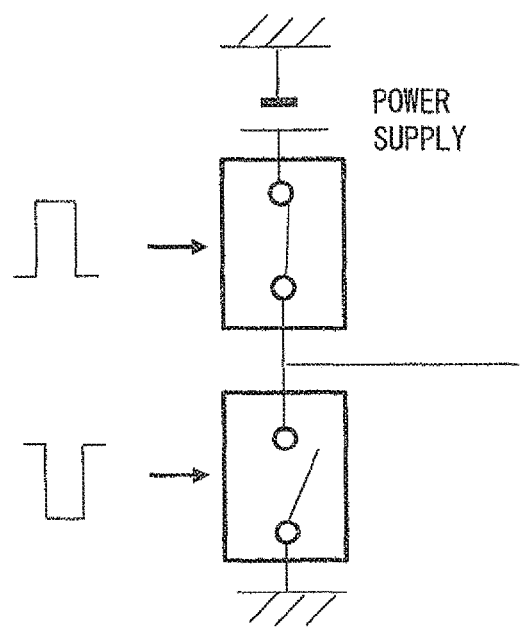
FIG. 7 is a circuit diagram showing a configuration example of a two-value D-class amplifier.
Figure 8:
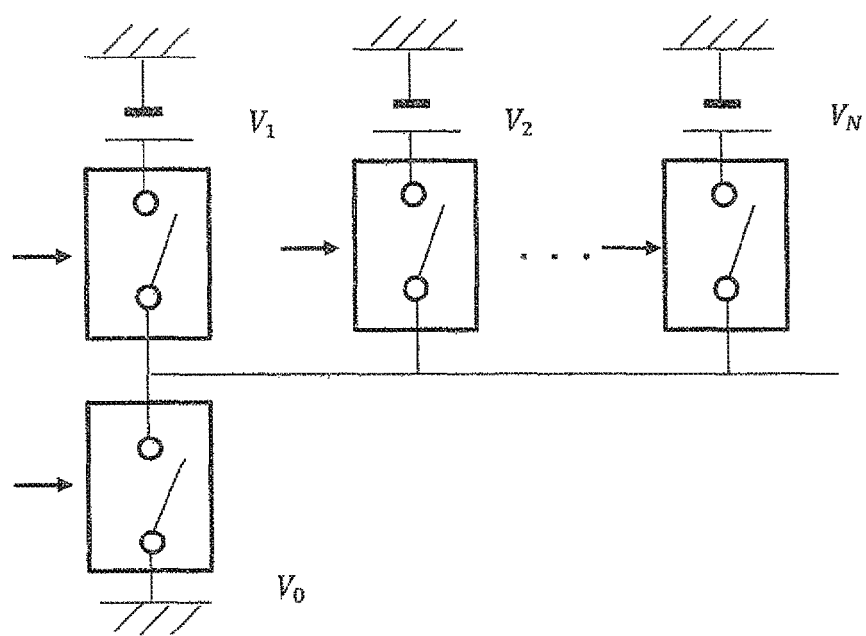
FIG. 8 is a circuit diagram showing a configuration example of a multi-value D-class amplifier.

The D-class amplifier 13 amplifies the pulse signal generated in the RF signal generator 12 and outputs the amplified signal. A two-value D-class amplifier shown in FIG. 7 or a multi-value D-class amplifier shown in FIG. 8 are used as the D-class amplifier 13.

Figure 2:
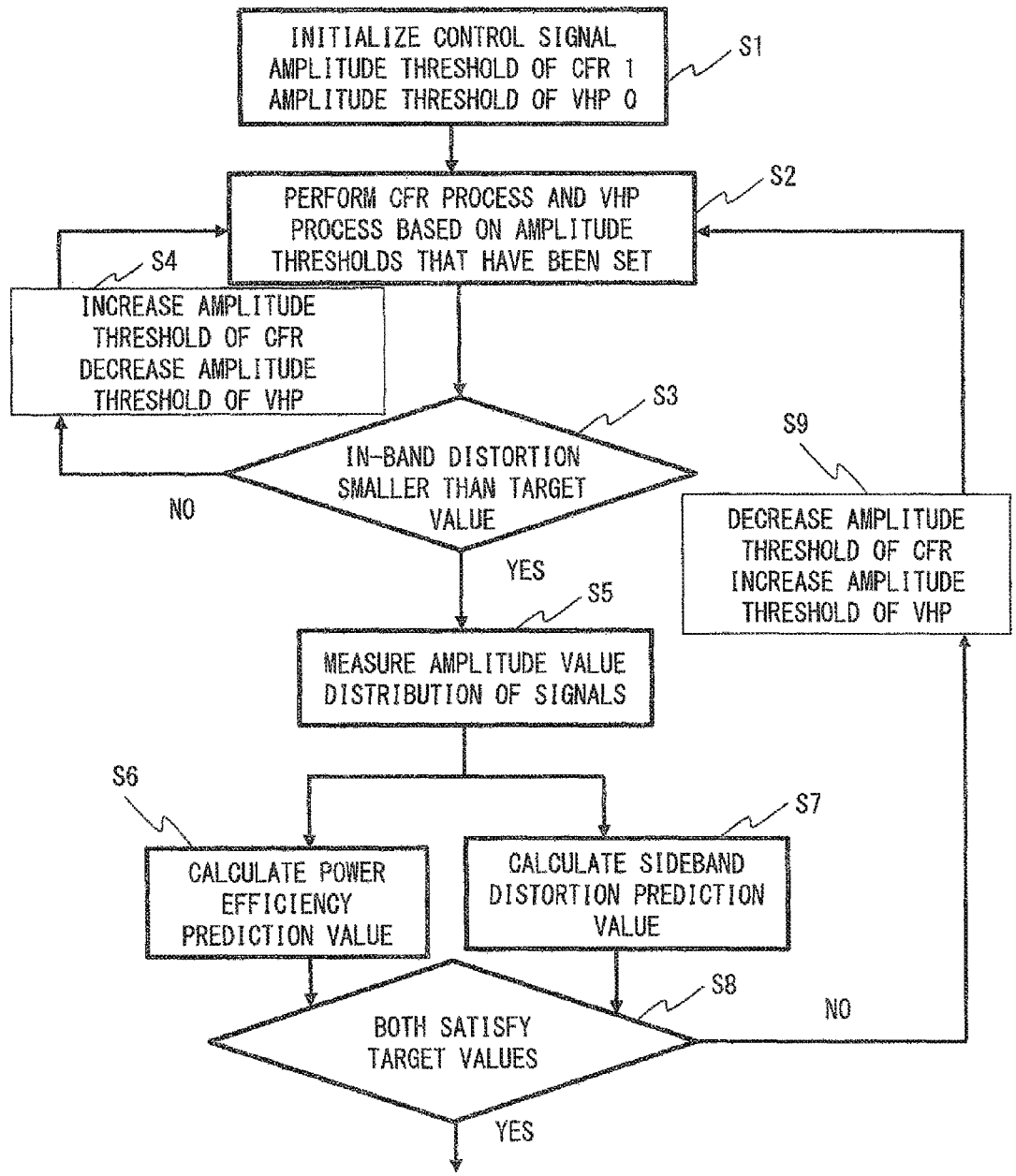
FIG. 2 is a flowchart showing threshold configuration processing of the transmitter according to the first exemplary embodiment.

FIG. 2 is a flowchart that defines the thresholds set in the threshold controller 18 in FIG. 1. The procedure thereof will be described below.

In S1, the threshold controller 18 initializes the thresholds, which are control signals. Specifically, in the baseband signal in which the maximum amplitude value is scaled to 1, the amplitude threshold of the CFR is set to 1 and the amplitude threshold of the VHP is set to 0, whereby the amplitude thresholds are set to values in which the CFR process and the VHP process are not executed. While the example in which the initial value of the amplitude threshold of the CFR is set to the maximum amplitude value of the baseband signal and the initial value of the amplitude threshold of the VHP is set to the minimum amplitude value of the baseband signal will be described here, the initial values of the amplitude thresholds of the CFR and the VHP are not limited to this example. The initial values of the amplitude thresholds of the CFR and the VHP may be other values that are arbitrarily determined in advance. Even when these initial values are arbitrarily determined, the values are appropriately adjusted in Steps S4 and S9 that will be performed later.

In S2, the baseband amplitude value distribution processor 11 performs the CFR process 11a and the VHP process 11b based on the amplitude thresholds shown as the control signals output from the threshold controller 18 at the current moment. The baseband amplitude value distribution processor 11 outputs the IQ signals on which the CFR process 11a and the VHP process 11b have been performed to the in-band distortion measurement unit 14 and the RF signal generator 12.

In S3, the in-band distortion measurement unit 14 measures an in-band distortion of the IQ signals output from the baseband amplitude value distribution processor 11 and outputs the measurement value to the threshold controller 18. The threshold controller 18 checks whether the measurement value of the in-band distortion output from the in-band distortion measurement unit 14 is below a target value that has been set in advance (in-bind distortion threshold). If the measurement value of the in-band distortion is smaller than the target value, the process goes to S5. When the measurement value of the in-band distortion is equal to or larger than the target value, the threshold controller 18 determines that the configurations of the amplitude thresholds for the CFR process and the VHP process are inappropriate, increases the amplitude threshold of the CFR and decreases the amplitude threshold of the VHP (S4), and then the process goes back to S1. Arbitrary amounts are determined in advance as the amount of the increase in the amplitude threshold of the CFR and the amount of the decrease in the signal amplification of the VHP.

The in-band distortion is based on the EVM or the MER depending on the modulation signal to be used. That is, the baseband amplitude value distribution processor 11 may arbitrarily use a value suitable for the type of the modulation signal to be processed among the values that change depending on the in-bind distortion such as the EVM or the MER as the in-band distortion. When the EVM is used as the index of the in-band distortion, the process in S3 may be the one already described above since the distortion amount becomes smaller as the value becomes smaller. However, when the MER is used as the index of the in-band distortion, the process goes back to S1 after the process S4 when the value is smaller than the target value in the process in S3 and the process goes to S5 when the value is equal to or larger than the target value in the process in S3 since the distortion amount becomes smaller as the value becomes larger. Since a known method of calculating the EVM, the MER and the like and a known circuit configuration that achieves them may be used, detailed descriptions thereof will be omitted.

In S5, the amplitude value distribution measurement unit 15 receives the IQ signals on which the CFR process and the VHP process have been executed for a predetermined period of time to measure a probability distribution of the amplitude values and outputs probability distribution information indicating the probability distribution that has been measured to the power efficiency prediction unit 16 and the sideband distortion prediction unit 17. In the probability distribution of the amplitude values of the modulation signals acquired at this time, the amplitude values of the modulation signals are scaled in such a way that the maximum value of the amplitude input to a ΔΣ modulator in the RF signal generator 12 becomes equal to the maximum value of the amplitude value that can be input to the ΔΣ modulator in the RF signal generator 12.

In S6, the power efficiency prediction unit 16 performs integral calculation using a power efficiency table indicating the power efficiency corresponding to the amplitude value based on the probability distribution of the amplitude values indicated by the probability distribution information output from the amplitude value distribution measurement unit 15, whereby the power efficiency prediction unit 16 predicts the power efficiency value in the D-class amplifier 13 and outputs the power efficiency value to the threshold controller 18. The power efficiency table is a table indicating, for each of the amplitude values that the modulation signal may have, the amplitude value and the power efficiency in the amplitude value associated with each other. The power efficiency prediction unit 16 acquires the power efficiency corresponding to each amplitude value from the power efficiency table, weights the power efficiency by the probability distribution and integrates the obtained value, to thereby calculate the power efficiency value. That is, the power efficiency corresponding to the amplitude value which is highly likely to exist in the IQ signals is multiplied by a large number.

The power efficiency table indicating the power efficiencies corresponding to the amplitude values can be created by actually sweeping the amplitude values, operating the transmitter, and measuring the power efficiencies. In other words, the power efficiency table is a table indicating a correlation (correspondence relationship) between the power efficiencies and the amplitude values of the signals obtained by measuring changes in the amplitude values of the signals input to the D-class amplifier 13 (RF signal generator 12) and changes in the power efficiencies in the D-class amplifier 13 when the signals are amplified. When the transmitter is not actually being operated, the power efficiency table may be created by calculating the power efficiencies by performing a simulation in which a parasitic element and a filter element (not shown in FIG. 1) of the D-class amplifier 13 provided in the subsequent stage are added to the actual transmitter. The power efficiency table may be stored in advance in a storage device included in the power efficiency prediction unit 16. A desired storage device such as a register, a memory or the like may be used, for example, as the storage device. The form of the information is not limited to the table and information having an arbitrary form may be used as long as the information indicates the correlation between the amplitude values of the signals and the power efficiencies.

In S7, the sideband distortion prediction unit 17 performs integral calculation using a sideband distortion table indicating a sideband distortion corresponding to the amplitude value based on the probability distribution of the amplitude values indicated by the probability distribution information output from the amplitude value distribution measurement unit 15, whereby the sideband distortion prediction unit 17 predicts the sideband distortion value generated in the RF signal generator 12 and the sideband distortion value is output to the threshold controller 18. The sideband distortion table is a table indicating, for each of the amplitude values that the modulation signal may have, the amplitude value and the sideband distortion in the amplitude value associated with each other. The sideband distortion prediction unit 17 acquires the sideband distortion corresponding to each amplitude value from the sideband distortion table, weights the sideband distortion by the probability distribution and integrates the obtained value, to thereby calculate the sideband distortion value. That is, the sideband distortion value corresponding to the amplitude value which is highly likely to exist in the IQ signals is multiplied by a large number.

The sideband distortion table indicating the sideband distortions corresponding to the amplitude values can be created by actually sweeping the amplitude values, operating the transmitter, and measuring the sideband distortions. In other words, the power efficiency table is a table indicating a correlation (correspondence relationship) between the amplitude values of the signals and the sideband distortion amounts obtained by measuring changes in the amplitude values of the signals input to the D-class amplifier 13 (RF signal generator 12) and changes in the sideband distortion amounts of the signals output from the D-class amplifier 13. When the transmitter is not actually operated, the sideband distortion table can be created by calculating the sideband distortions by performing a simulation by sweeping the amplitude values of the ΔΣ modulation of the RF signal generator 12. The sideband distortion table may be stored in advance in a storage device included in the sideband distortion prediction unit 17. A desired storage device may be used, similar to the above case, as the storage device. The form of the information is not limited to the table and information having an arbitrary form may be used as long as the information indicates the correlation between the amplitude values of the signals and the sideband distortion amounts.

The sideband distortion amount is based on the ACLR, Alternate Channel Power Ratio (ACPR) and the like for each modulation signal to be used. That is, values suitable for the type of the modulation signal to be processed may be arbitrarily used among the values that change depending on the sideband distortion such as the ACLR, the ACPR and the like as the sideband distortion.

In S8, the threshold controller 18 determines whether the power efficiency value output from the power efficiency prediction unit 16 and the sideband distortion amount output from the sideband distortion prediction unit 17 satisfy the respective target values (thresholds) set in advance. When the power efficiency value is equal to or larger than the target value (power efficiency threshold), for example, it is determined that the power efficiency value satisfies the target value and when the sideband distortion amount is smaller than the target value (sideband distortion amount threshold), it is determined that the sideband distortion amount satisfies the target value. When both of the target values are satisfied, the threshold controller 18 directly outputs the IQ signals. When at least one of the target values is not satisfied, the threshold controller 18 decreases the amplitude threshold of the CFR and increases the amplitude threshold of the VHP (S9) and the process goes back to S1. Desired amounts are determined as the amount of the decrease in the amplitude threshold of the CFR and the amount of the increase in the signal amplification of the VHP.

According to this series flow, it is possible to set the appropriate amplitude thresholds for the CFR and the VHP regardless of the type of the modulation signal (regardless of the amplitude value distribution of the signal) and change the amplitude value distribution of the baseband signals so that the distortion becomes low and the power efficiency becomes high.

As described above, in this exemplary embodiment, the threshold when the amplitude value distribution of the baseband signals (IQ signals) is changed is adjusted to reduce the sideband distortion amount when the sideband distortion amount is large based on the sideband distortion amount predicted based on the amplitude value distribution of the baseband signal. More specifically, when the sideband distortion amount that has been predicted is equal to or larger than a predetermined threshold, the amplitude threshold of the CFR is decreased and the amplitude threshold of the VHP is increased. It is therefore possible to reduce the sideband distortion.

Further, in this exemplary embodiment, the threshold when the amplitude value distribution of the baseband signals (IQ signals) is changed is adjusted to decrease the in-band distortion amount when the in-band distortion amount is large based on the in-band distortion amount measured from the baseband signal. More specifically, when the in-band distortion amount that has been predicted is equal to or larger than the predetermined threshold, the amplitude threshold of the CFR is increased and the amplitude threshold of the VHP is decreased. It is therefore possible to reduce the in-band distortion.

That is, the amplitude value distribution of the baseband signals is adjusted so that it is possible to collectively decrease the in-band distortion and the sideband distortion, to thereby achieving a low distortion.

Further, in this exemplary embodiment, the threshold when the amplitude value distribution of the baseband signals (IQ signals) is changed is adjusted to increase the power efficiency value (to improve the power efficiency) when the power efficiency value is low based on the power efficiency value predicted based on the amplitude value distribution of the baseband signal. More specifically, when the power efficiency value that has been predicted is lower than a predetermined threshold, the amplitude threshold of the CFR is decreased and the amplitude threshold of the VHP is increased. It is therefore possible to achieve a high power efficiency.

Second Exemplary Embodiment

Figure 3:
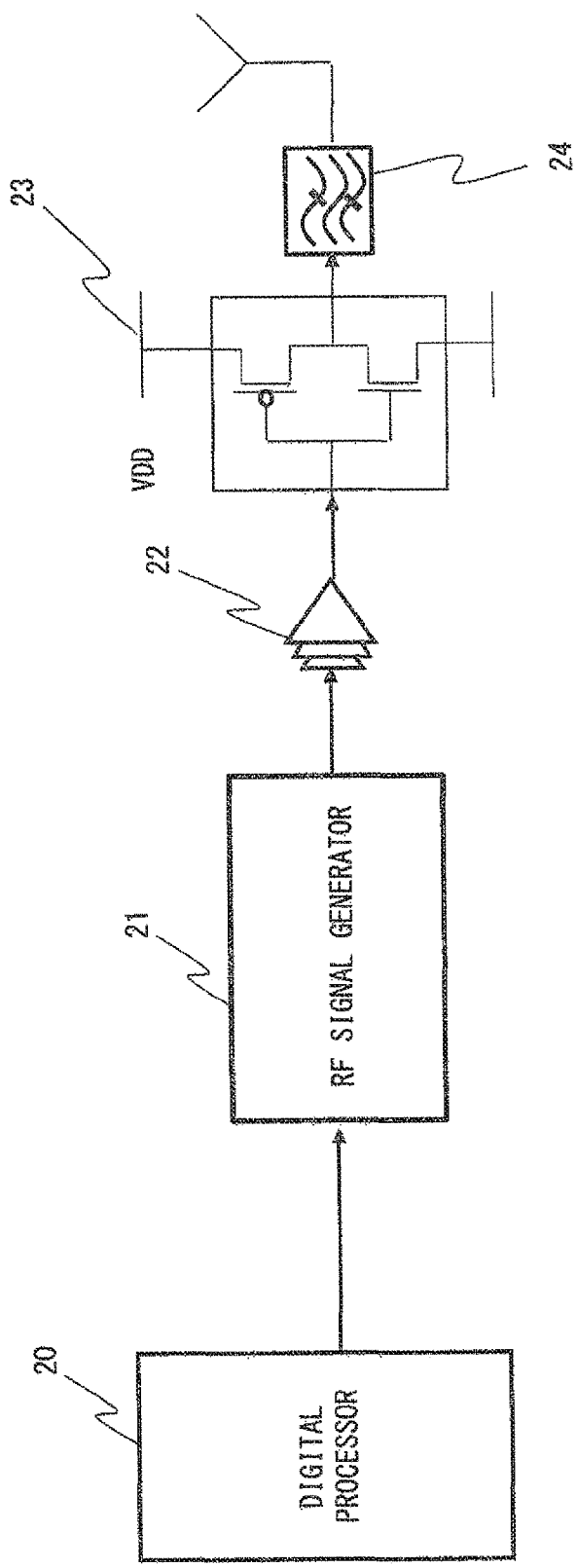
FIG. 3 is a block diagram showing one configuration example of a transmitter according to a second exemplary embodiment.

Some of the functions of the computation processing in the digital circuit in the transmitter according to the first exemplary embodiment can be combined using a processor such as a Field-Programmable Gate Array (FPGA). FIG. 3 shows a configuration of a transmitter when the above processes are combined by a digital processor 20.

The transmitter shown in FIG. 3 includes a digital processor 20, an RF signal generator 21, a driver amplifier 22, a D-class amplifier 23, and a bandpass filter 24. The RF signal generator 21 is similar to the RF signal generator 12 shown in FIG. 1 and the D-class amplifier 23 is similar to the D-class amplifier 13.

The digital processor 20 includes the functions of the baseband signal generator 10, the baseband amplitude value distribution processor 11, the in-band distortion measurement unit 14, the amplitude value distribution measurement unit 15, the power efficiency prediction unit 16, the sideband distortion prediction unit 17, and the threshold controller 18 shown in FIG. 1. The digital processor 20 is achieved by a processor such as an FPGA or a Digital Signal Processor (DSP).

The digital processor 20 outputs the IQ signals that have been generated to the RF signal generator 21. The RF signal generator 21 generates a pulse signal from the IQ signals output from the digital processor 20 and outputs the pulse signal to the driver amplifier 22. The amplitude of the pulse signal output from the RF signal generator 21 is amplified in the driver amplifier 22 and the D-class amplifier 23 and the obtained signal is output to the bandpass filter 24, where the components other than a desired bandwidth are attenuated and then the resulting signal is output.

As described above, the baseband amplitude value distribution processor 11, the in-band distortion measurement unit 14, the amplitude value distribution measurement unit 15, the power efficiency prediction unit 16, the sideband distortion prediction unit 17, and the threshold controller 18 may be formed of one processor.

Third Exemplary Embodiment

A third exemplary embodiment is an application example when the first exemplary embodiment and a Digital Pre-Distortion (DPD), which is a distortion compensation technique, are combined with each other.

The DPD is a technique of distorting signals to be input to the amplifier by a pre-distorter in advance, whereby the distortion by the amplifier is cancelled and a signal amplification with low distortion is achieved. More specifically, the DPD has characteristics of modelling distortion characteristics of the amplifier according to amplitude components of the signal input to the amplifier, calculating a non-linear filter having the inverse characteristics thereof, and using it in a pre-distorter.

In order to extract the distortion characteristics of the amplifier, it is required to obtain baseband components of the output signal of the amplifier. By down-converting the output signal of the amplifier, baseband components are obtained and the distortion characteristic model of the amplifier and the inversion characteristic model thereof are calculated based on the input and output baseband signals with respect to the amplifier. Hereinafter, with reference to FIG. 4, the configuration thereof will be described.

Figure 4:
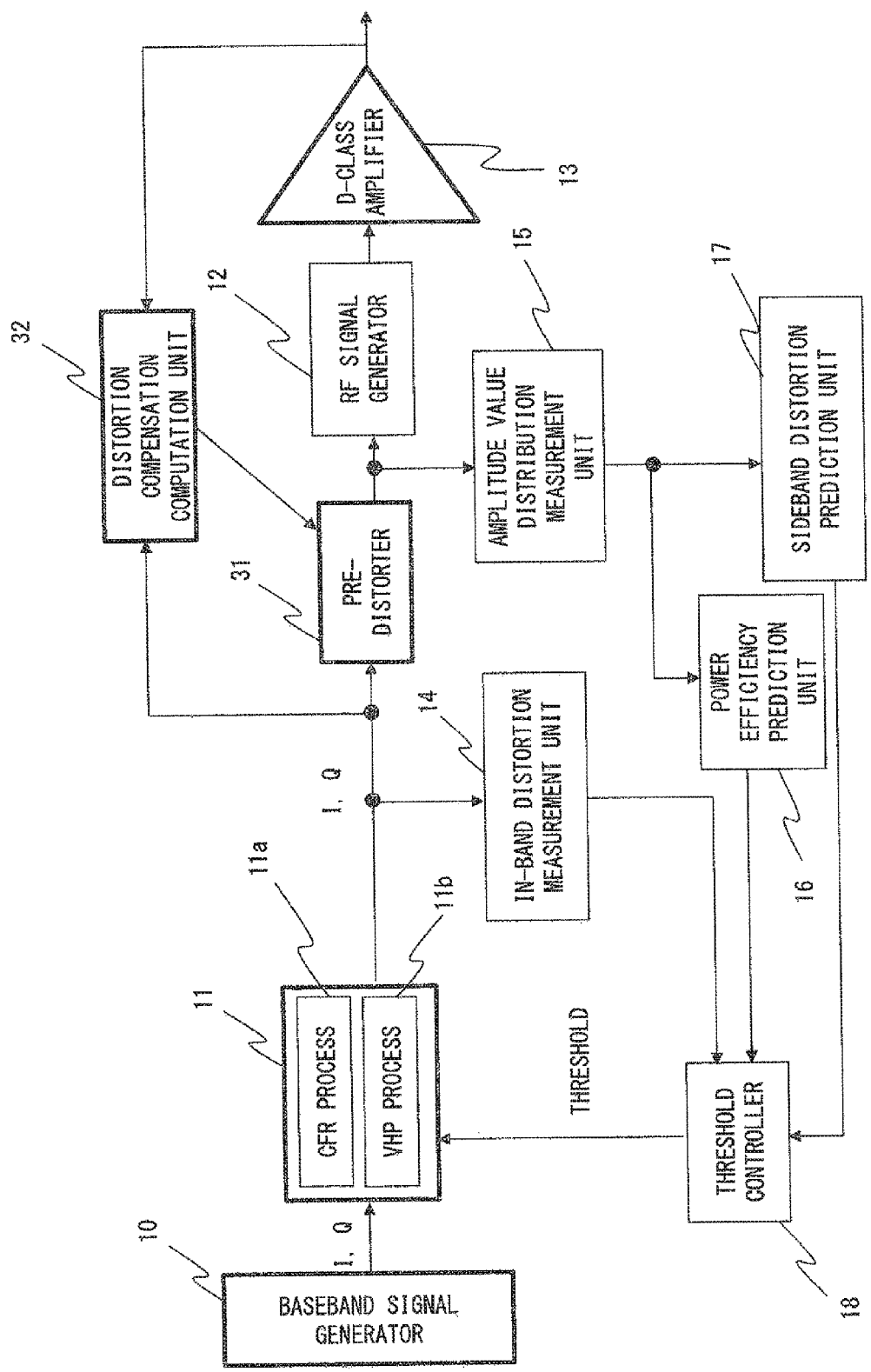
FIG. 4 is a block diagram showing one configuration example of a transmitter according to a third exemplary embodiment.

The transmitter shown in FIG. 4 includes a baseband signal generator 10, a baseband amplitude value distribution processor 11, an RF signal generator 12, a D-class amplifier 13, an in-band distortion measurement unit 14, an amplitude value distribution measurement unit 15, a power efficiency prediction unit 16, a sideband distortion prediction unit 17, a threshold controller 18, a pre-distorter 31, and a distortion compensation computation unit 32.

Since the functions other than the pre-distorter 31 and the distortion compensation computation unit 32 are similar to those in the first exemplary embodiment, the difference between the first exemplary embodiment and the third exemplary embodiment will be described below. In the transmitter shown in FIG. 4, the baseband amplitude value distribution processor 11 outputs IQ signals to the in-band distortion measurement unit 14, the pre-distorter 31, and the distortion compensation computation unit 32. Further, the IQ signals output from the pre-distorter 31 are input to the RF signal generator 12 and the amplitude value distribution measurement unit 15.

The distortion compensation computation unit 32 has a function of modelling the distortion occurring in the D-class amplifier 13 based on the IQ components of the output signal of the D-class amplifier 13 and the IQ signals of the output of the baseband amplitude value distribution processor 11 synchronized by a delay adjustment and updating the coefficient of the filter that achieves the inverse distortion characteristic. That is, the distortion compensation computation unit 32 calculates the coefficient of the filter that achieves the inverse distortion characteristic and outputs the coefficient of the filter that has been calculated to the pre-distorter 31.

The pre-distorter 31 operates a filter having the inverse distortion characteristic of the D-class amplifier 13 controlled by the coefficient output from the distortion compensation computation unit 32 on the IQ signals output from the baseband amplitude value distribution processor 11 to compensate for the distortion occurring in the D-class amplifier 13. The pre-distorter 31 outputs the IQ signals in which the distortion has been compensated to the RF signal generator 12 and the amplitude value distribution measurement unit 15.

According to the update of the coefficient calculated in the distortion compensation computation unit 32, the amplitude value distribution of the modulation signals output from the pre-distorter 31 is changed. In accordance therewith, the values calculated in the power efficiency prediction unit 16 and the sideband distortion prediction unit 17 are changed and the thresholds calculated in the threshold controller 18 are changed as well.

By repeating these cycles, it is possible to achieve amplification with high power efficiency and low distortion in the D-class amplifier 13.

As described above, by combining the distortion compensate by the elements 11 and 14 to 18 in the first exemplary embodiment and the distortion compensation by the pre-distorter 31, it is possible to further reduce the distortion.

Fourth Exemplary Embodiment

Figure 5:
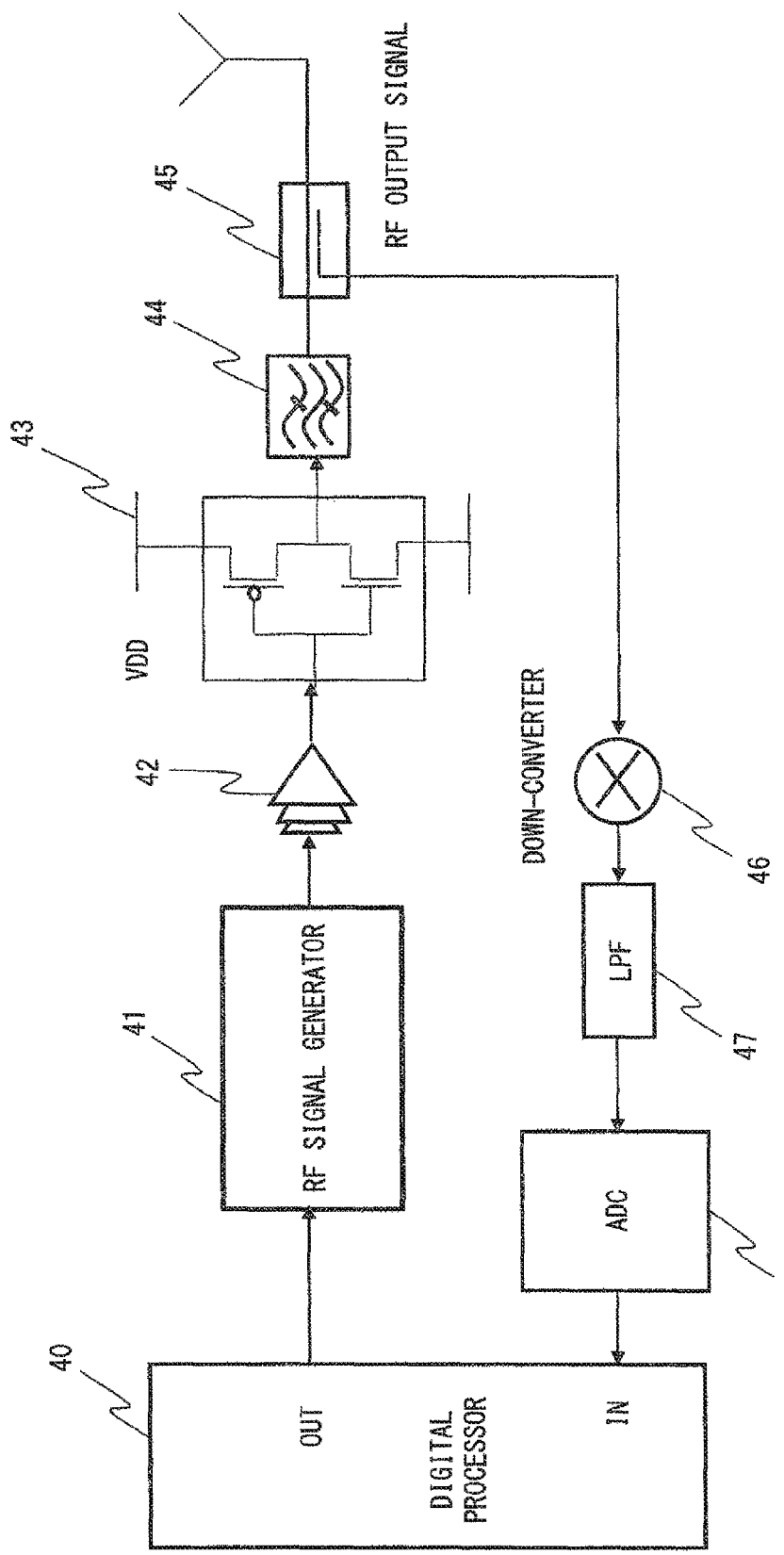
FIG. 5 is a block diagram showing one configuration example of a transmitter according to a fourth exemplary embodiment.

Some of the functions of the computation processing in the digital circuit in the transmitter in the third exemplary embodiment may be combined by using a processor such as a Field-Programmable Gate Array (FPGA). FIG. 5 shows a configuration of a transmitter when the above processes are combined by the digital processor 20.

The transmitter shown in FIG. 5 includes a digital processor 40, an RF signal generator 41, a driver amplifier 42, a D-class amplifier 43, a bandpass filter 44, a coupler 45, a down-converter 46, a low-pass filter (LPF) 47, and an AD converter (ADC) 48. The RF signal generator 41 is similar to the RF signal generator 12 shown in FIG. 4 and the D-class amplifier 43 is similar to the D-class amplifier 13.

The digital processor 40 has functions of the baseband signal generator 10, the baseband amplitude value distribution processor 11, the in-band distortion measurement unit 14, the amplitude value distribution measurement unit 15, the power efficiency prediction unit 16, the sideband distortion prediction unit 17, the threshold controller 18, the pre-distorter 31, and the distortion compensation computation unit 32 shown in FIG. 4. The digital processor 40 is formed of a processor such as an FPGA or a Digital Signal Processor (DSP).

The digital processor 40 outputs the IQ signals that have been generated to the RF signal generator 41. The RF signal generator 21 generates a pulse signal from the IQ signals output from the digital processor 20 and outputs the pulse signal to the driver amplifier 42. The amplitude of the pulse signal output from the RF signal generator 21 is amplified in the driver amplifier 42 and the D-class amplifier 43 and the amplified signal is output to the bandpass filter 44. In the bandpass filter 44, components other than a desired bandwidth are attenuated and the resulting signal is output to the coupler 45 as an RF output signal.

The RF output signal output from the bandpass filter 44 is fed back via the coupler 45. That is, the coupler 45 distributes the RF output signal output from the bandpass filter 44 and outputs the RF output signal to the down-converter 46. The RF output signal output from the coupler 45 is down-converted by the down-converter 46 and the LPF 47 and is then converted into a digital baseband signal by the ADC 48.

The ADC 48 outputs the baseband signals converted from analog into digital to the digital processor 20. The digital processor 40 compares the baseband signals output from the ADC 48 with the baseband signal generated in the digital processor 40 to execute the function of the distortion compensation computation unit 32.

As described above, the baseband signal generator 10, the baseband amplitude value distribution processor 11, the in-band distortion measurement unit 14, the amplitude value distribution measurement unit 15, the power efficiency prediction unit 16, the sideband distortion prediction unit 17, the threshold controller 18, the pre-distorter 31, and the distortion compensation computation unit 32 may be formed of one processor.

Outline of Exemplary Embodiments

Figure 6:
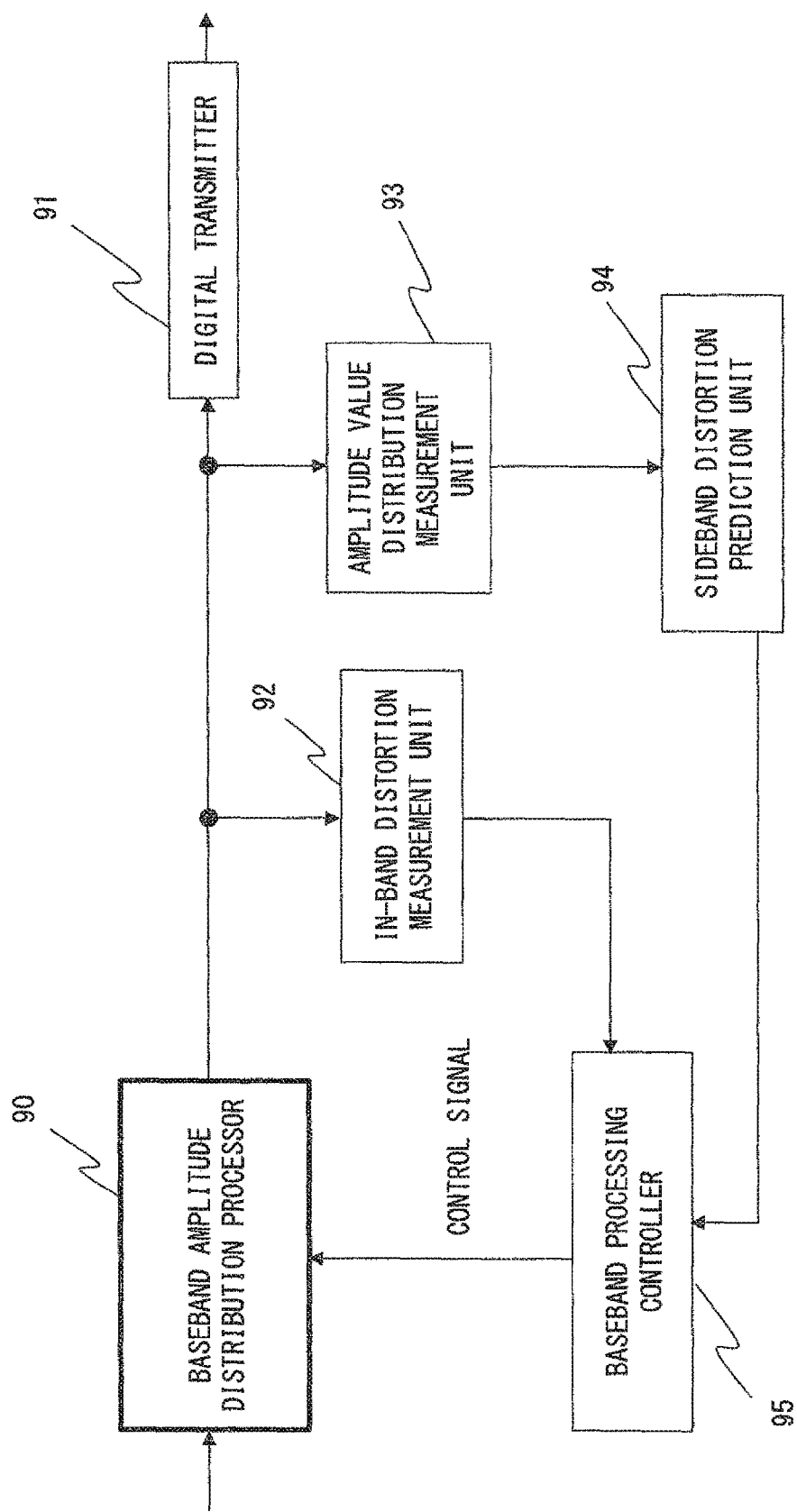
FIG. 6 is a schematic configuration diagram of the transmitter according to the exemplary embodiments.

The outline of the above exemplary embodiments may be expressed by the configurations described below. The outline of the configurations of the above exemplary embodiments will now be described. FIG. 6 is a schematic configuration diagram of a transmitter according to the exemplary embodiments of the present invention.

The transmitter according to the schematic configuration includes a baseband amplitude value distribution processor 90, a digital transmitter 91, an in-band distortion measurement unit 92, an amplitude value distribution measurement unit 93, a sideband distortion prediction unit 94, and a baseband processing controller 95.

The baseband amplitude value distribution processor 90 changes the distribution of the amplitude values of the baseband signals based on the control signals that have been input and then outputs the resulting signal as an output signal. The baseband amplitude value distribution processor 90 corresponds to the baseband signal generator 10.

The digital transmitter 91 ΔΣ modulates the output signal of the baseband amplitude value distribution processor 90 and transmits the ΔΣ modulated signal. The digital transmitter 91 corresponds to the RF signal generators 12, 21, and 41 and the D-class amplifiers 13, 23, and 44.

The in-band distortion measurement unit 92 measures the in-band distortion amount of the output signal of the baseband amplitude value distribution processor 90. The in-band distortion measurement unit 92 corresponds to the in-band distortion measurement unit 14.

The amplitude value distribution measurement unit 93 calculates the amplitude value distribution of the output signal of the baseband amplitude value distribution processor 90. The amplitude value distribution measurement unit 93 corresponds to the amplitude value distribution measurement unit 15.

The sideband distortion prediction unit 94 predicts the sideband distortion amount occurring in the output signal in the digital transmitter 91 from the amplitude value distribution calculated in the amplitude value distribution measurement unit 93. The sideband distortion prediction unit 94 corresponds to the sideband distortion prediction unit 17.

The baseband processing controller 95 adjusts the control signals to be input to the baseband amplitude value distribution processor 90 and outputs the adjusted signals based on the in-band distortion amount measured in the in-band distortion measurement unit 92 and the sideband distortion amount predicted in the sideband distortion prediction unit 94. The baseband processing controller 95 corresponds to the threshold controller 18.

According to the configuration described above, it is possible to suppress the increase in the in-band distortion amount while reducing the sideband distortion amount occurring in the ΔΣ modulation based on the in-band distortion amount that has been measured and the sideband distortion amount that has been predicted. It is possible to change the distribution of the amplitude values of the baseband signals. It is therefore possible to change the distribution of the amplitude values of the baseband signals and reduce the distortion to suppress the increase in the in-band distortion amount and the increase in the sideband distortion amount.

While the present invention has been described with reference to the exemplary embodiments, the present invention is not limited to the above exemplary embodiments. Various changes that can be understood by those skilled in the art can be made to the configurations and the details of the present invention within the scope of the present invention.

In the above exemplary embodiments, both the prediction value of the power efficiency and the prediction value of the sideband distortion are calculated and it is determined whether these prediction values satisfy the respective target values. However, only one of the prediction values may be calculated (only one of Steps S6 and S7 may be executed) and it may be determined in Step S8 whether the prediction value satisfies the target value. Even when only the prediction value of the sideband distortion is calculated and determined, the distortion can be reduced and even when only the prediction value of the power efficiency is calculated and determined, it is possible to enhance the power efficiency. As a matter of course, when only the prediction value of the sideband distortion is calculated and determined, the transmitter may not include the power efficiency prediction unit 16 and when only the prediction value of the power efficiency is calculated and determined, the transmitter may not include the sideband distortion prediction unit 17.

Further, while both the CFR and the VHP are executed in the above exemplary embodiments, only one of the CFR and the VHP may be executed. However, both the CFR and the VHP are preferably executed, whereby it is possible to appropriately achieve both the reduction in the distortion and the enhancement in the power efficiency.

This application is based upon and claims the benefit of priority from Japanese Patent Application No. 2013-203892, filed on Sep. 30, 2013, the disclosure of which is incorporated herein in its entirety by reference.

REFERENCE SIGNS LIST

10 BASEBAND SIGNAL GENERATOR
11 BASEBAND AMPLITUDE VALUE DISTRIBUTION PROCESSOR
12, 21, 41, 120, 220 RF SIGNAL GENERATOR
13, 23, 43, 140, 240 D-CLASS AMPLIFIER
14, 92 IN-BAND DISTORTION MEASUREMENT UNIT
15, 93 AMPLITUDE VALUE DISTRIBUTION MEASUREMENT UNIT
16 POWER EFFICIENCY PREDICTION UNIT
17, 94 SIDEBAND DISTORTION PREDICTION UNIT
18 THRESHOLD CONTROLLER
20, 40 DIGITAL PROCESSOR
22, 42, 130, 230 DRIVER AMPLIFIER
24, 44 BANDPASS FILTER
31 PRE-DISTORTER
32 DISTORTION COMPENSATION COMPUTATION UNIT
45 COUPLER
46 DOWN-CONVERTER
47 LPF
48 ADC
90 BASEBAND AMPLITUDE VALUE DISTRIBUTION PROCESSOR
91 DIGITAL TRANSMITTER
95 BASEBAND PROCESSING CONTROLLER
110, 210 DIGITAL BASEBAND CIRCUIT
221 IQ MODULATOR
222 COMPARATOR
223 ΔΣ MODULATOR
224 MULTIPLIER
250 FILTER

The invention claimed is:
1. A transmitter comprising:
a baseband amplitude value distribution processor that changes a distribution of an amplitude value of a baseband signal based on a control signal that has been input and outputs the baseband signal as an output signal;

a digital transmitter that ΔΣ modulates the output signal of the baseband amplitude value distribution processor and transmits the modulated signal;

an in-band distortion measurer that measures an in-band distortion amount of the output signal of the baseband amplitude value distribution processor;

an amplitude value distribution measurer that calculates an amplitude value distribution of the output signal of the baseband amplitude value distribution processor;

a sideband distortion predictor that predicts a sideband distortion amount occurring in the output signal in the digital transmitter from the amplitude value distribution calculated in the amplitude value distribution measurer; and a baseband processing controller that adjusts the control signal to be input to the baseband amplitude value distribution processor based on the in-band distortion amount measured in the in-band distortion measurer and the sideband distortion amount predicted in the sideband distortion predictor and outputs the adjusted control signal, wherein the sideband distortion predictor calculates the sideband distortion amount using a correlation of the amplitude value of the output signal and the sideband distortion amount obtained by measuring changes in the amplitude value of the output signal to be input to the digital transmitter and changes in the sideband distortion amount of the modulated signal to be output from the digital transmitter.

2. The transmitter according to claim 1, further comprising a power efficiency predictor that predicts a power efficiency of the digital transmitter from the amplitude value distribution calculated in the amplitude value distribution measurer, wherein:

the digital transmitter performs the ΔΣ modulation on the output signal of the baseband amplitude value distribution processor and amplifies the signal that has been ΔΣ modulated, the power efficiency predictor calculates a prediction value of the power efficiency using the correlation of the amplitude value of the signal and the power efficiency obtained by measuring changes in the amplitude value of the signal to be input to the digital transmitter and changes in the power efficiency in the digital transmitter when the signal is processed and outputs the prediction value to the baseband processing controller, and the baseband processing controller further adjusts the control signal based on the prediction value of the power efficiency output from the power efficiency predictor.

3. The transmitter according to claim 1, wherein the baseband amplitude value distribution processor changes the amplitude value distribution of the output signal by at least one of Crest Factor Reduction (CFR) and Vector Hole Punch (VHP) and outputs a resulting signal.

4. The transmitter according to claim 3, wherein the baseband processing controller changes at least one threshold of the CFR and the VHP of the baseband amplitude value distribution processor as the adjustment of the control signal.

5. The transmitter according to claim 2, wherein the power efficiency predictor acquires the power efficiency in each amplitude value based on the correlation of the amplitude value of the signal and the power efficiency, weights each power efficiency that has been acquired by the amplitude value distribution calculated in the amplitude value distribution measurer and integrates a resultant value to thereby calculate the prediction value of the power efficiency of the digital transmitter.

6. The transmitter according to claim 1, wherein the sideband distortion predictor acquires the sideband distortion in each amplitude value based on the correlation of the amplitude value of the signal and the sideband distortion amount, weights each sideband distortion that has been acquired by the amplitude value distribution calculated in the amplitude value distribution measurer and integrates a resultant value to thereby calculate the sideband distortion amount occurring in the output signal in the digital transmitter.

7. The transmitter according to claim 1, wherein the digital transmitter comprises a ΔΣ modulator that receives an amplitude signal and a phase signal extracted from two orthogonal signals as the output signal, ΔΣ modulates the amplitude signal using the phase signal as a clock signal and outputs the modulated signal as the output signal, and a multiplier that multiplies the output signal of the ΔΣ modulator by the phase signal to generate a pulse signal.

8. The transmitter according to claim 1, wherein the digital transmitter comprises two ΔΣ modulators that receive two orthogonal signals as the output signal, ΔΣ modulate the two orthogonal signals, and output the modulated signal as the output signal, a frequency converter that up-converts the output signal of the two ΔΣ modulators into a frequency of a desired radio signal and outputs the up-converted signal, and an adder that adds the output signal of the frequency converter.

9. A transmission control method comprising:

changing a distribution of an amplitude value of a baseband signal based on a control signal that has been input and outputting the baseband signal as an output signal;

ΔΣ modulating the output signal that has been output and transmitting the modulated signal by a digital transmitter;

measuring an in-band distortion amount of the output signal that has been output;

calculating an amplitude value distribution of the output signal that has been output;

predicting a sideband distortion amount occurring in the output signal by the ΔΣ modulation from the amplitude value distribution that has been calculated;

adjusting the control signal based on the in-band distortion amount that has been measured and the sideband distortion amount that has been predicted and outputting the control signal; and calculating the sideband distortion amount using a correlation of the amplitude value of the output signal and the sideband distortion amount obtained by measuring changes in the amplitude value of the output signal to be input to the digital transmitter and changes in the sideband distortion amount of the modulated signal to be output from the digital transmitter.

* * * * *

UNITED STATES PATENT AND TRADEMARK OFFICE
CERTIFICATE OF CORRECTION

PATENT NO.           : 9,748,983 B2
APPLICATION NO.      : 15/023719
DATED                : August 29, 2017
INVENTOR(S)          : Masaaki Tanio Page 1 of 1

It is certified that error appears in the above-identified patent and that said Letters Patent is hereby corrected as shown below:

In the Claims

Column 18, Claim 9:
Line 57, after "the", insert --adjusted--.

Signed and Sealed this
Twenty-seventh Day of March, 2018

Andrei Iancu
*Director of the United States Patent and Trademark Office*